(12) United States Patent
McMahill

(10) Patent No.: US 7,002,504 B2
(45) Date of Patent: Feb. 21, 2006

(54) DYNAMIC ELEMENT MATCHING IN HIGH SPEED DATA CONVERTERS

(75) Inventor: Daniel R. McMahill, Arlington, MA (US)

(73) Assignee: Maxim Integrated Products, Inc., Sunnyvale, CA (US)

(*) Notice: Subject to any disclaimer, the term of this patent is extended or adjusted under 35 U.S.C. 154(b) by 0 days.

(21) Appl. No.: 10/429,589

(22) Filed: May 5, 2003

(65) Prior Publication Data

US 2004/0222912 A1 Nov. 11, 2004

(51) Int. Cl.
H03M 1/12 (2006.01)
(52) U.S. Cl. ..................... 341/161; 341/155
(58) Field of Classification Search ............. 341/155, 341/156, 161, 159
See application file for complete search history.

(56) References Cited

U.S. PATENT DOCUMENTS

| 6,072,416 | A  | * | 6/2000 | Shima ................... 341/159 |
| 6,172,629 | B1 | * | 1/2001 | Fetterman ............... 341/131 |
| 6,281,828 | B1 | * | 8/2001 | Kimura et al. ........... 341/155 |
| 6,359,467 | B1 | * | 3/2002 | McCarroll et al. ......... 326/37 |
| 6,433,711 | B1 | * | 8/2002 | Chen ..................... 341/118 |

OTHER PUBLICATIONS

Leung, Bosco H. et al., "Multibit Σ-Δ A/D Converter Incorporating A Novel Class of Dynamic Element Matching Techniques", IEEE Transactions on Circuits and Systems—II: Analog and Digital Signal Processing, Jan. 1992, Pgs. 35-51, vol. 39, No. 1.

Galton, Ian, "Digital Cancellation of D/A Converter Noise in Pipelined A/D Converters" IEEE Transactions on Circuits and Systems—II: Analog and Digital Signal Processing, Mar. 2000, Pgs. 185-196, vol. 47, No. 3.

* cited by examiner

Primary Examiner—Peguy JeanPierre
(74) Attorney, Agent, or Firm—Blakely, Sokoloff, Taylor & Zafman LLP

(57) ABSTRACT

A method for providing dynamic element matching of capacitors in a pipelined analog to digital converter (ADC). Instead of randomizing the output of a flash ADC before providing the output of the ADC to the capacitor array, the threshold voltages from a reference ladder are randomized. This eliminates multiple, series connected switches of a randomizer between the output of a comparator bank and the capacitor array, and may be done during the time the output of the comparator bank of the flash ADC is latched, thereby not negatively impacting the speed of operation of the pipelined ADC.

12 Claims, 2 Drawing Sheets

DYNAMIC ELEMENT MATCHING IN HIGH SPEED DATA CONVERTERS

BACKGROUND OF THE INVENTION

1. Field of the Invention

The present invention relates to the field of digital to analog converters (DACs).

2. Prior Art

One approach to dynamic element matching in a pipelined analog to digital converter (ADC) stage is illustrated in FIG. 1. In this Figure, the reference ladder provides 16 equally spaced reference voltage levels, typically using a corresponding resistor ladder. The comparator bank contains an equal number of comparators, and compares the input signal with each of the reference levels to provide an equal number of outputs. In FIG. 1, a four bit flash ADC is illustrated, so that the output of the comparator bank is a 16-bit code. The code is called a thermometer code because any such output will be characterized by all bits of the code corresponding to reference voltage levels below the input voltage will be of one state, and all bits thereafter corresponding to reference voltage levels above the input voltage will be of the opposite state.

A multiplying digital to analog converter (MDAC) of FIG. 1 may look like the circuit in FIG. 2. On clock phase 1 ($\phi_1$), the input is sampled onto the input capacitor array and the feedback capacitor $C_{FB}$ is reset by closure of the switch across the feedback capacitor. At the end of $\phi_1$, the sample switches are opened and the comparator bank is strobed to latch the thermometer code. During $\phi_2$, the 16 thermometer code signals from the ADC are randomized by the code randomizer (See FIG. 1) and after randomization, are each used to drive a respective MDAC switch to connect the capacitor array elements to $\pm V_{REF}$, depending on the state of the respective thermometer code signal. The goal of the randomizer is to reduce distortion caused by mismatch in the capacitor array by randomly or pseudo-randomly coupling each capacitor of the capacitor array to different comparator bank outputs, sample time to sample time.

The difficulty with this approach is that the time available for op-amp (FIG. 2) settling is reduced by the delay through the randomizer. One possible randomizer consists of several stages of "butterfly" swappers. For a 16 threshold flash ADC, 4 stages are desired. This results in 4 series switches between the comparator bank and the capacitor array. Thus, traditional approaches to dynamic matching reduce the time allowed for amplifier settling, which requires faster amplifiers and ultimately limits sample rate.

DETAILED DESCRIPTION OF THE PREFERRED EMBODIMENTS

In the description to follow, for purposes of specificity in setting out one exemplary embodiment, and not for purposes of limitation, an embodiment of the present invention comprising a four bit flash analog to digital (ADC) converter which may be used as one stage of a multistage multiplying digital to analog converter (MDAC) is described. It is to be understood however, that the flash ADC may be used for other purposes, and/or implemented in larger or smaller bit-size versions.

Figure 1:
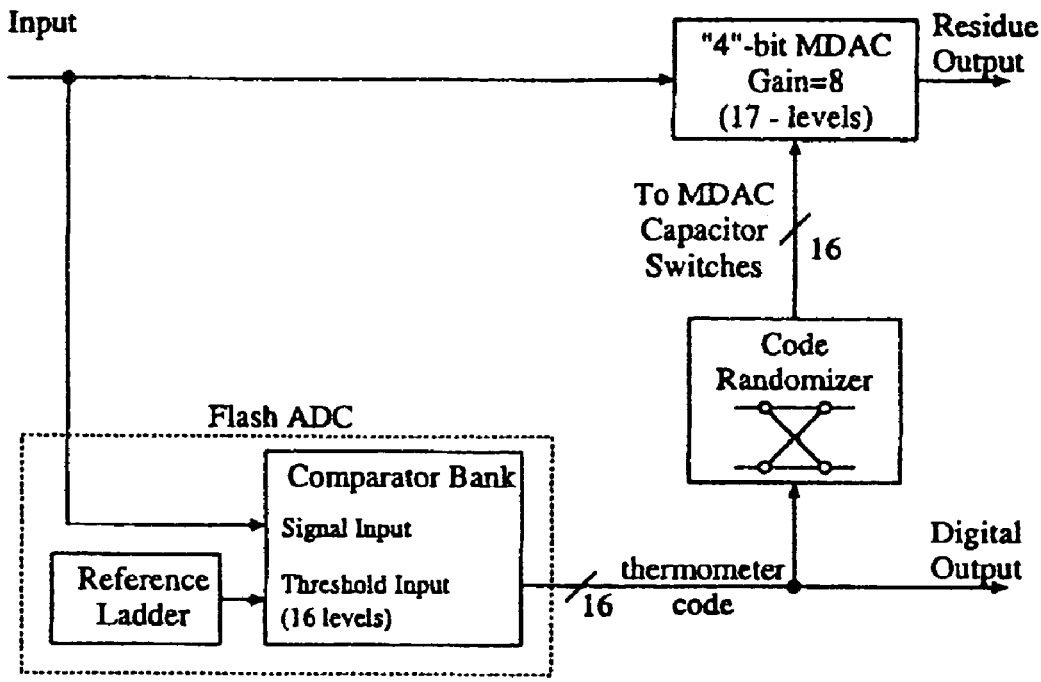
FIG. 1 is a diagram illustrating a prior art dynamic element matching in a pipelined analog to digital converter (ADC) stage.
Figure 2:
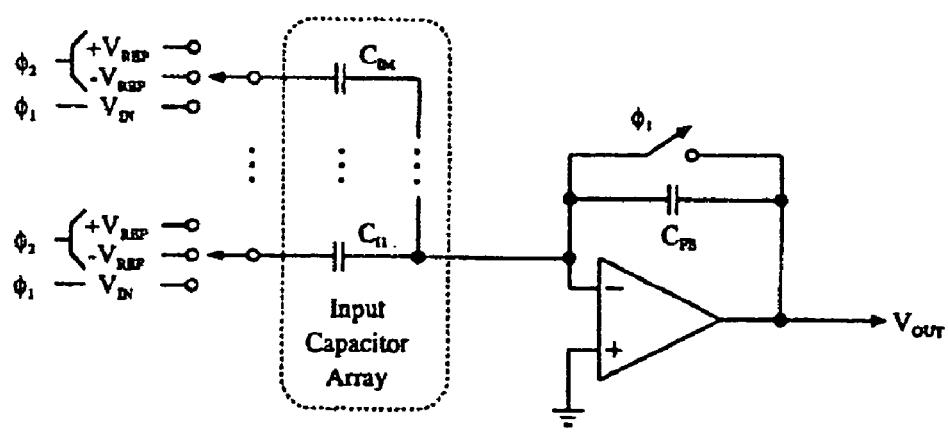
FIG. 2 is a diagram illustrating further detail of the digital to analog converter of FIG. 1.
Figure 3:
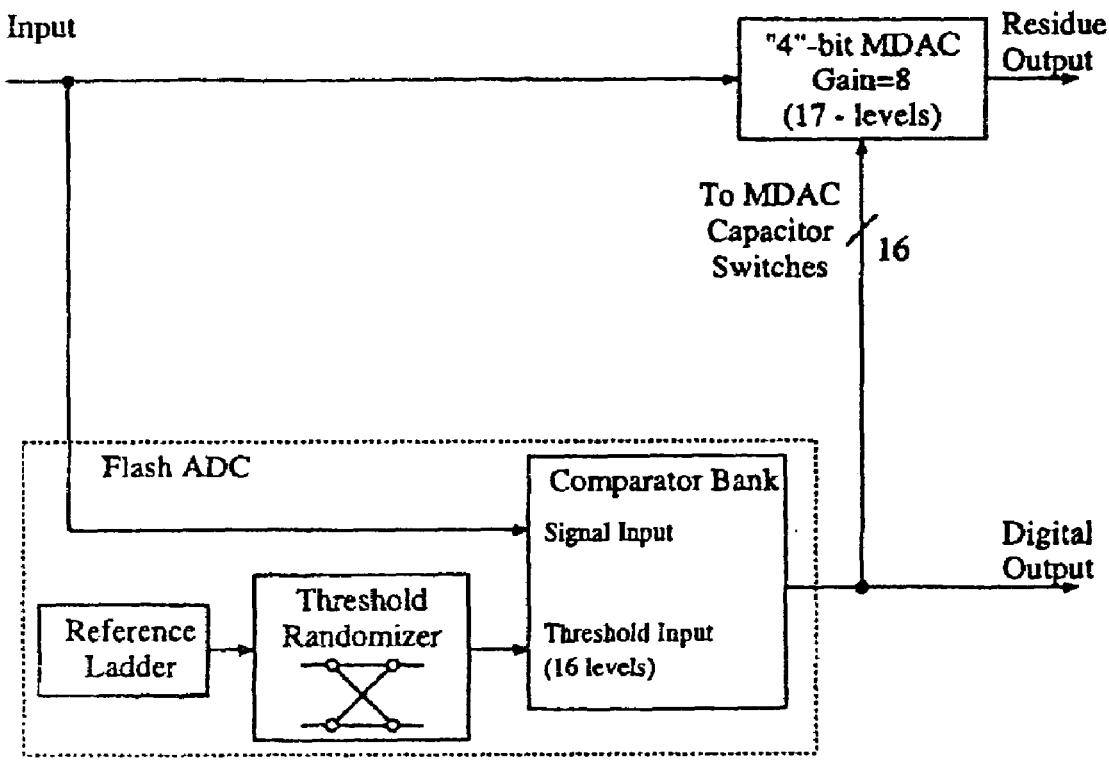
FIG. 3 is a diagram illustrating one embodiment of the present invention.

In accordance with the present invention, an improvement which can potentially eliminate the speed penalty associated with the DEM (dynamic element matching) is shown in FIG. 3. In this approach, the 16 threshold voltages which drive the comparators in the flash ADC are randomized. This achieves the same effect in terms of randomizing the capacitor mismatch as in the prior art. However, the randomizer settling can take place during the clock phase where the flash is inactive (comparators in latch mode).

The randomizing of the threshold voltages allows substantially direct connection of the output of the comparator bank to the capacitor array, eliminating the multiple, series connected switches between the comparator bank and the capacitor array of the prior art. While the randomizing of the threshold voltages also randomizes the thermometer code of the digital output of the flash ADC, that randomization is of little consequence, as the value of the code is indicated by the number of thermometer code signals that are in a particular state, independent of the location of the signals of that state in the 16 bit code. Consequently, code integrity is maintained, and the same may readily be converted to binary form using any of various techniques. As but one example, a second randomizer configured to provide the inverse randomization of the threshold voltage randomizer may be used to "un-randomize" the thermometer code of the digital output of the Flash ADC (but not the signals provided to the MDAC), with the thermometer code then being converted to binary form using conventional techniques.

Figure 4:
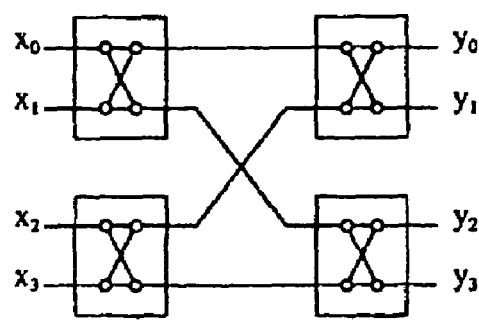
FIG. 4 is a diagram illustrating a 2-bit butterfly randomizer switch network.

A possible implementation of the reference ladder randomizer switch network is a butterfly type randomizer and can be found in the literature. For example, see "Digital cancellation of D/A converter noise in pipelined A/D converters" (I. Galton) or "Multibit $\Sigma$-$\Delta$ A/D converter incorporating a novel class of dynamic element matching techniques" (B. H. Leung et al.). FIG. 4 shows a 2-bit (4 signal) butterfly randomizer. This network has been used in the traditional dynamic element matching approach. The switch network consists of several blocks that either pass their two inputs straight through to the two outputs, or depending on the value of a control line, swap the two inputs before sending them to the outputs. An N-bit randomizer consists of a $2^{N-1}$ array of the 2-bit swappers.

In the foregoing description, it is perhaps inferred that the threshold randomizer (FIG. 3) randomizes each threshold value to any of all lines to the comparator bank. This may be by coupling each randomized threshold voltage to a different comparator on each clock cycle, or alternatively, to coupling each randomized threshold voltage to a different comparator on different clock cycles, but not necessarily on each successive clock cycle, i.e., the randomization may leave one or more threshold voltages coupled to the same comparator or comparators for two or more successive clock cycles. Whatever technique is used, randomization of all threshold voltages to all comparators may be preferred, though improvements in the performance may be expected if the randomizing is less than complete, such as, by way of example, randomizing each threshold value to 1 of 8 comparators in a comparator bank of 16 comparators. Alternatively, one might randomize less than all the threshold voltages. By way of example, randomization might be chosen in conjunction with the capacitor array itself, and more particularly with respect to the capacitors in the capacitor array that may be expected to have the greatest variation from the nominal value due to their location, expected processing gradients and/or other effects. In any embodiment, the randomization may be pseudo-random, though other randomization techniques may be used as desired.

The present invention has been specifically disclosed herein with respect to switched capacitor MDACs as an illustration of specific embodiments. However, it should be noted that the shuffling of flash comparator thresholds is equally applicable to any DAC architecture used in a pipelined ADC, whether it be a switched capacitor MDAC, a switched current DAC or some other form of DAC. Thus while certain preferred embodiments of the present invention have been disclosed herein, it will be obvious to those skilled in the art that various changes in form and detail, a few of which have been mentioned herein, may be made in the invention without departing from the spirit and scope of the invention as set out in the)full scope of the following claims.

What is claimed is:

1. A converter stage for a pipelined analog to digital converter comprising:
    a flash ADC having a reference ladder providing a plurality of threshold voltages, a threshold randomizer coupled to the threshold voltages of the reference ladder to randomize the threshold voltages, and an equal plurality of comparators to provide comparator outputs responsive to an analog input coupled to each comparator and a respective one of the randomized threshold voltages; and,
    a multiplying digital to analog converter stage having an input capacitor array, the input capacitor array being coupled to the outputs of the plurality of comparators,
    wherein the number of threshold voltages and the number of comparators are both N, and the threshold randomizer is configured to randomize the coupling of the threshold voltages, each to a subset of the N comparators.

2. A converter stage for a pipelined analog to digital converter comprising:
    a flash ADC having a reference ladder providing a plurality of threshold voltages, a threshold randomizer coupled to the threshold voltages of the reference ladder to randomize the threshold voltages, and an equal plurality of comparators to provide comparator outputs responsive to an analog input coupled to each comparator and a respective one of the randomized threshold voltages; and,
    a multiplying digital to analog converter stage having an input capacitor array, the input capacitor array being coupled to the outputs of the plurality of comparators;
    wherein the threshold randomizer randomizes less than all the threshold voltages.

3. A method of operating a converter stage of a pipelined analog to digital converter for dynamic element balancing comprising:
    providing a plurality of threshold voltages from a reference ladder;
    providing an equal plurality of comparators, each for comparing an analog input to that stage to a threshold voltage;
    coupling the output of the comparators to a capacitor array of a multiplying digital to analog converter; and
    randomizing the coupling of at least some of the threshold voltages so that on different clock cycles, different threshold voltages are coupled to at least some of the comparators.

4. The method of claim 3 wherein randomizing the coupling of the threshold voltages comprises randomizing the coupling of all the threshold voltages so that on different clock cycles, different threshold voltages are coupled to all of the comparators.

5. The method of claim 3 wherein randomizing the coupling of the threshold voltages comprises randomizing the coupling of the threshold voltages, each to a subset of the N comparators.

6. The method of claim 3 wherein randomizing the coupling of the threshold voltages comprises randomizing less than all the threshold voltages.

7. In a converter stage for a pipelined analog to digital converter, the improvement comprising:
    a flash ADC having a reference ladder providing a plurality of threshold voltages, a threshold randomizer coupled to the threshold voltages from the reference ladder to randomize the threshold voltages, and an equal plurality of comparators to provide comparator outputs responsive to an analog input coupled to each comparator and a respective one of the randomized threshold voltages, wherein the number of threshold voltages and the number of comparators are both N, and the threshold randomizer is configured to randomize the coupling of the threshold voltages, each to a subset of the N comparators.

8. In a converter stage for a pipelined analog to digital converter, the improvement comprising:
    a flash ADC having a reference ladder providing a plurality of threshold voltages, a threshold randomizer coupled to the threshold voltages from the reference ladder to randomize the threshold voltages, and an equal plurality of comparators to provide comparator outputs responsive to an analog input coupled to each comparator and a respective one of the randomized threshold voltages, wherein the threshold randomizer randomizes less than all the threshold voltages.

9. A method of operating a converter stage of a pipelined analog to digital converter for dynamic element balancing comprising:
    providing a plurality of threshold voltages from a single, fixed reference ladder;
    providing an equal plurality of comparators, each for comparing an analog input to that stage to a threshold voltage; and
    randomizing the coupling of at least some of the threshold voltages so that on different clock cycles, different threshold voltages are coupled to at least some of the comparators.

10. The method of claim 9 wherein randomizing the coupling of the threshold voltages comprises randomizing the coupling of all the threshold voltages so that on different clock cycles, different threshold voltages are coupled to all of the comparators.

11. The method of claim 9 wherein randomizing the coupling of the threshold voltages comprises randomizing the coupling of the threshold voltages, each to a subset of the N comparators.

12. The method of claim 9 wherein randomizing the coupling of the threshold voltages comprises randomizing less than all the threshold voltages.

* * * * *